US006409363B1

(12) United States Patent
Wolff et al.

(10) Patent No.: US 6,409,363 B1
(45) Date of Patent: Jun. 25, 2002

(54) CONTROL AND SIGNALING DEVICE OR SIGNALING DEVICE WITH A LUMINOUS ELEMENT

(75) Inventors: Bernd Wolff, Hennef; Joerg Schaefer, Rheinbach; Juergen Volberg, Troisdorf; Juergen Hoegener, Niederkassel, all of (DE)

(73) Assignee: Moeller GmbH, Bonn (DE)

( * ) Notice: Subject to any disclaimer, the term of this patent is extended or adjusted under 35 U.S.C. 154(b) by 0 days.

(21) Appl. No.: 09/674,088

(22) PCT Filed: Feb. 23, 2000

(86) PCT No.: PCT/EP00/01462

§ 371 (c)(1),
(2), (4) Date: Oct. 25, 2000

(87) PCT Pub. No.: WO00/52383

PCT Pub. Date: Sep. 8, 2000

(30) Foreign Application Priority Data

Feb. 27, 1999 (DE) .......................................... 199 08 574

(51) Int. Cl.[7] ................................................. B60Q 3/04
(52) U.S. Cl. ......................... 362/362; 362/23; 362/800; 174/59
(58) Field of Search ................. 362/800, 362, 362/374, 375, 23; 174/59, 60

(56) References Cited

U.S. PATENT DOCUMENTS

| 4,219,172 A |   | 8/1980  | Murayama ................ 248/27.3 |
| 5,161,872 A | * | 11/1992 | Sasaki et al. ........... 362/800 X |
| 5,180,221 A | * | 1/1993  | Yoder ..................... 362/800 X |
| 5,253,144 A |   | 10/1993 | Schoenberger et al. ..... 361/736 |
| 5,565,839 A | * | 10/1996 | Poss ....................... 362/800 X |
| 5,684,667 A |   | 11/1997 | Hsieh ......................... 361/119 |

FOREIGN PATENT DOCUMENTS

| DE | 35 38 187    | 4/1986  |
| DE | 86 29 515.2  | 4/1987  |
| DE | 39 01 533    | 8/1990  |
| DE | 44 38 489    | 5/1996  |
| DE | 195 03 678   | 8/1996  |
| DE | 196 51 140   | 6/1997  |
| DE | 298 00 780   | 5/1998  |
| FR | 2 576 719    | 8/1986  |
| WO | WO 97/42799  | 11/1997 |

OTHER PUBLICATIONS

*—Forschungsvereinigung [Research Association] "Raumliche Elektronische Baugruppen" [Three Dimensional Electronic Modules], May 1998, p. 13.

* cited by examiner

Primary Examiner—Laura K. Tso
(74) Attorney, Agent, or Firm—Kenyon & Kenyon

(57) ABSTRACT

A control and signaling unit or a signaling unit having a light-emitting element, made up of a front element and a mounting adapter for locking the functional elements into place. This is achieved in that only one light-emitting diode having a diode crown and connecting wires are integrated in the functional element, the diode crown being embedded and retained in a receptacle, the light-emitting diode having an angle of radiation of 30–45°. The light-emitting diode has a luminosity of at least 0.5 candela, and an electronic circuit is arranged on circuit conductors, secured to the inner housing wall of a housing half and applied using a foil heat-embossing process.

6 Claims, 4 Drawing Sheets

CONTROL AND SIGNALING DEVICE OR SIGNALING DEVICE WITH A LUMINOUS ELEMENT

FIELD OF THE INVENTION

The present invention relates to a control and signaling unit or to a signaling unit having a light-emitting element.

RELATED TECHNOLOGY

German Patent Document No. 298 00 780 describes a functional element for a signaling unit having a light-emitting element, the signaling unit being made of a front element and a mounting adapter for locking the functional elements into place. The functional element has a luminous means including a bayonet-catch type mount fixture. An incandescent lamp is used as a luminous means. However, it has the drawback of a service life that is shorter than that of other luminous means, such as of light-emitting diodes. The insulating enclosure is provided with circuit conductors, which are arranged using the (two-component injection molding) production method of MID [molded interconnected device] technology, as described in German Patent Document No. 298 0078.

Furthermore, circuit conductors have been applied using the heat-embossing method, as described in the company prospectus of the 3-D MID e.V. Forschungsvereinigung [Research Association] "Räumliche Elektronische Baugruppen" [Three-Dimensional Electronic Modules] May 1998, page 13.

It is generally known in signaling units, to use light-emitting diodes. Due to the lower luminosity in comparison to incandescent lamps, it has been necessary to use several, however, at least two light-emitting diodes.

SUMMARY OF THE INVENTION

An object of the present invention is to devise a control and signaling unit, or a signaling unit, having a light-emitting element, which is inexpensive and uncomplicated to manufacture.

The present invention provides a control and signaling unit or a signaling unit having a light-emitting element, comprised of a front element and a mounting adapter for locking the functional elements into place, characterized in that only one light-emitting diode (3), including a diode crown (5) and connecting wires (4), is intergrated in the functional element (2), the diode crown (5) being embedded and retained in a receptacle (6), that the light-emitting diode (3) has an angle of radiation of 30–45°, that the light-emitting diode (3) has a luminosity of at least 0.5 candela, and that an electronic circuit is arranged on circuit conductors (11) secured to the inner housing wall of a housing half (1) and applied using a foil heat-embossing process.

BRIEF DESCRIPTION OF THE DRAWINGS

The present invention, further embodiments and improvements thereof, as well as additional advantages shall be described and elucidated on the basis of the drawings, in which.

DETAILED DESCRIPTION

Figure 1:
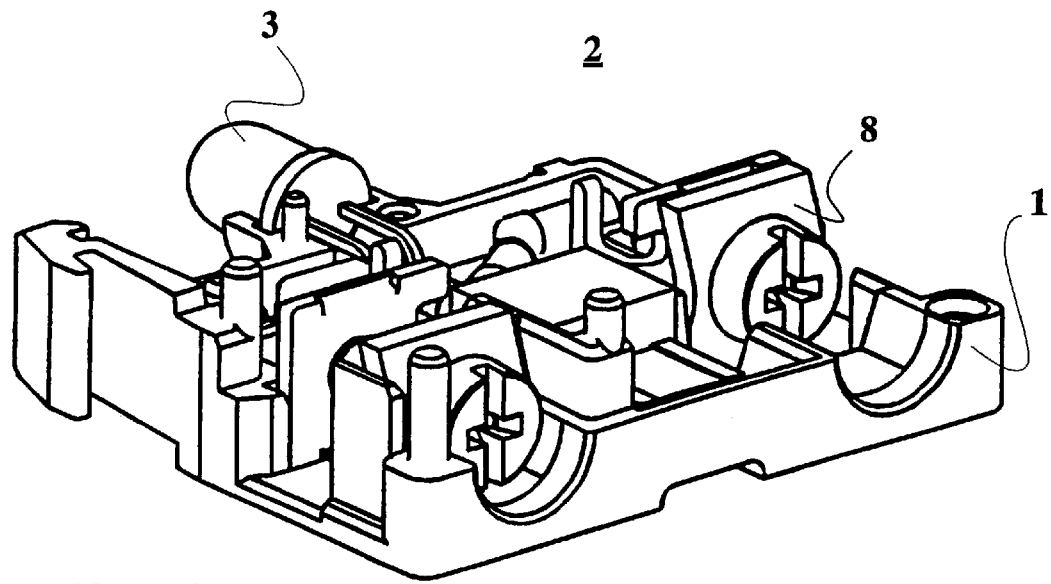
FIG. 1 shows a perspective view of a functional element having only one housing half.
Figure 2:
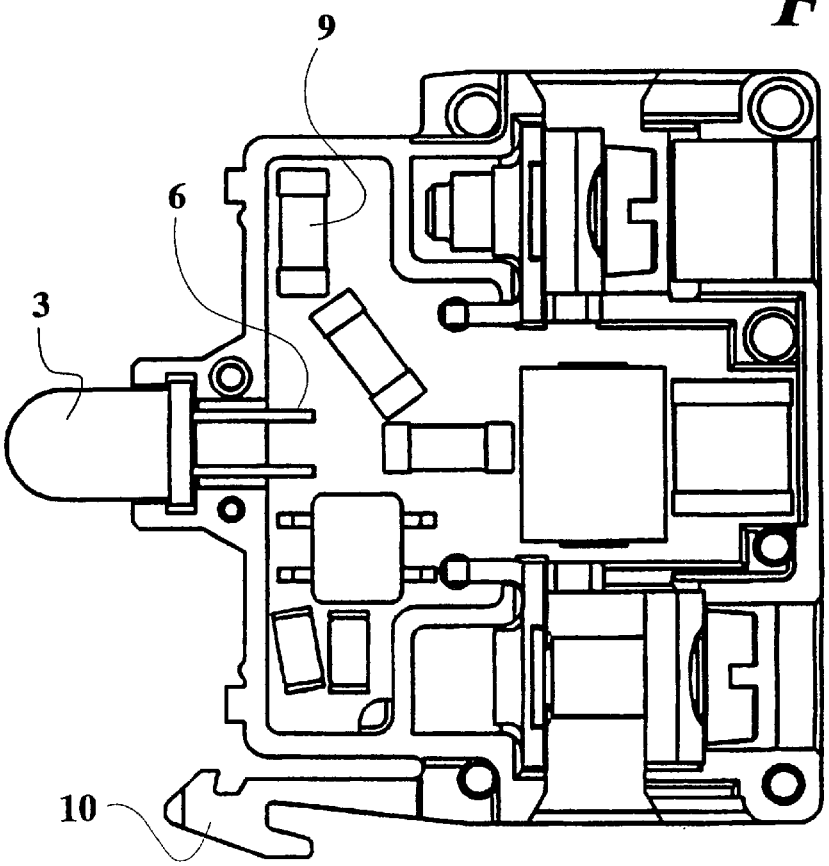
FIG. 2 shows a representation of the open functional element, from above.

FIG. 1 illustrates a housing half 1 of functional element 2 including a light-emitting diode 3.

The control and signaling unit (not shown in its entirety), which can be an illuminated pushbutton, or the signaling unit, which can be an indicator light, is provided with a light-emitting element, made up of a front element and a mounting adapter for locking functional elements 2 into place.

In accordance with the present invention, only one light-emitting diode 3 having a diode crown 5 and connecting wires 4 are integrated in a functional element 2, diode crown 5 being embedded and retained in a receptacle 6, light-emitting diode 3 having an angle of radiation of 30–45°, and light-emitting diode 3 having a luminosity of at least 0.5 candela.

The 30–45° angle of radiation means that light strikes as concentrated rays on the inner surface of the diode crown, making the illuminated crown appear especially bright. By using a light-emitting diode 3 having a luminosity of at least 0.5 candela, excellent illumination of the signaling units is achieved. The color rendering is clearly better than in the case of incandescent lamps.

In addition, as shown in FIG. 1, functional element 2 has clamp terminals 8, an electronic circuit including electronic components 9, and at least one latch 10.

FIGS. 3 through 6 illustrate the process of forming circuit conductors 11, which are arranged on the inside of housing half 1. The process is described as heat embossing and is described in greater detail in the prospectus "Forschungsvereinigung Räumliche Elektronische Baugruppen", 3-D MID e.V. [Research Association for Three-Dimensional Electronic Modules, which is hereby incorporated by reference herein].

Figures 3, 4:
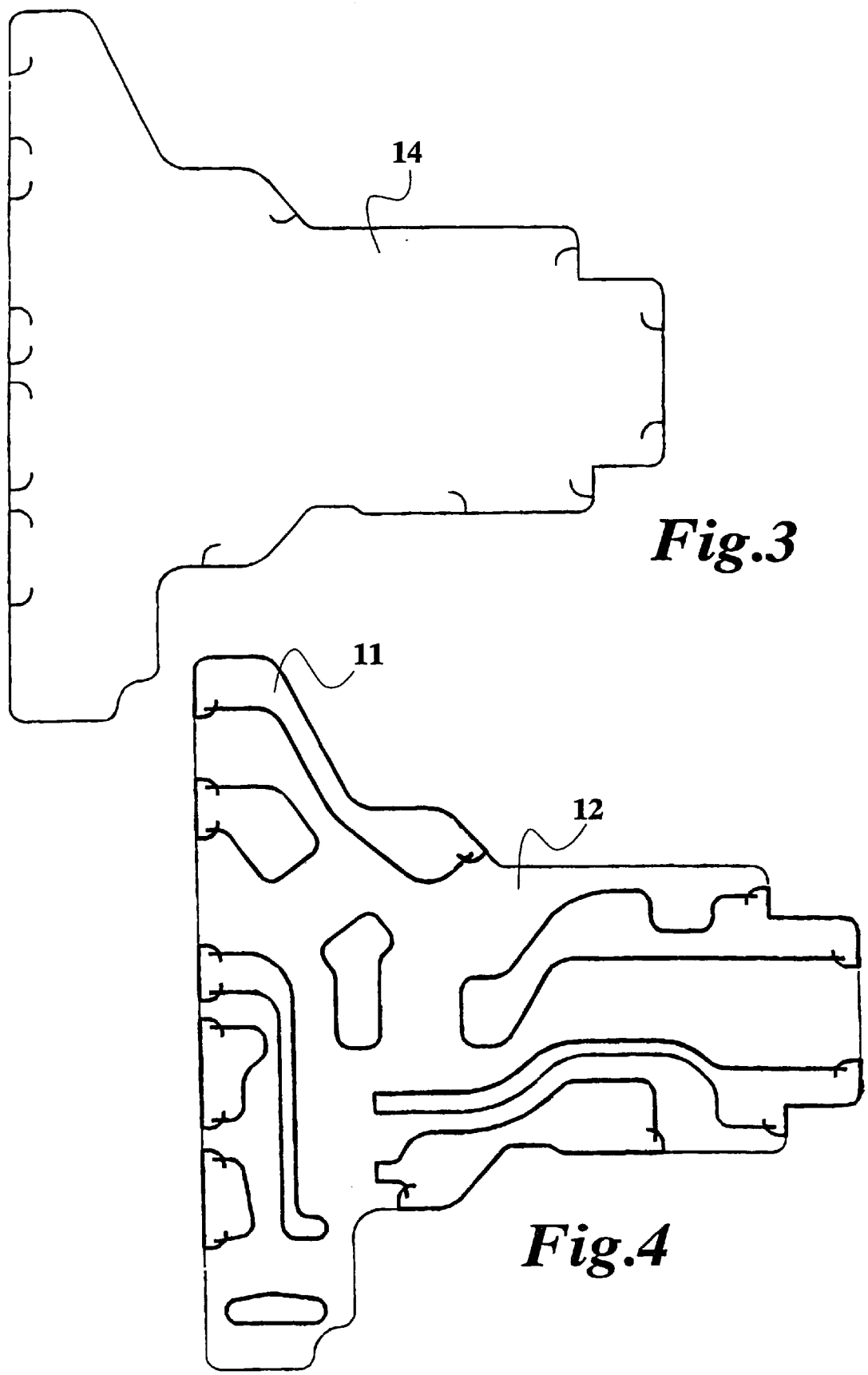
FIG. 3 shows a representation of the outer contour of the conductor arrangement.
FIG. 4 shows a representation of the embossed conductors, including residual foil.
Figure 5:
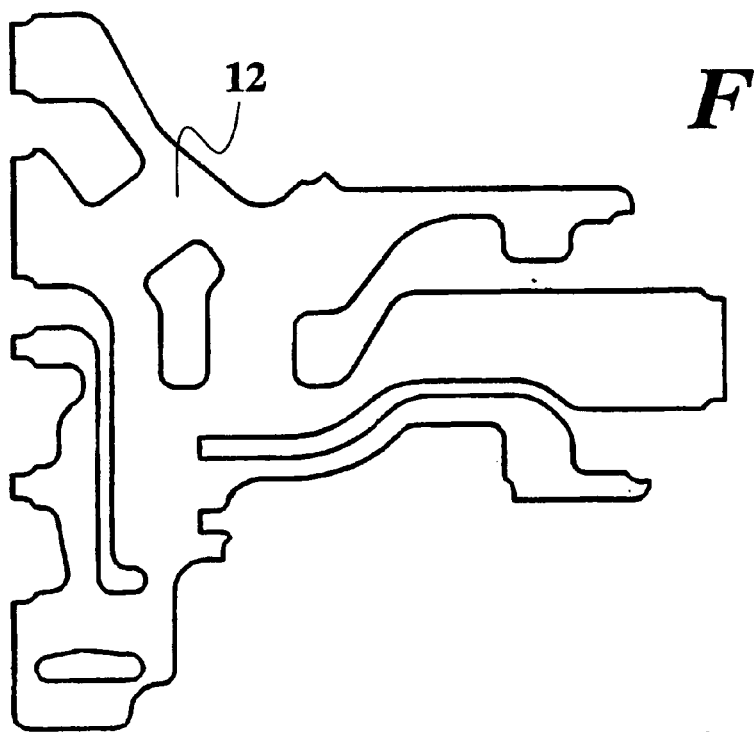
FIG. 5 shows a representation of the residual foil.
Figure 6:
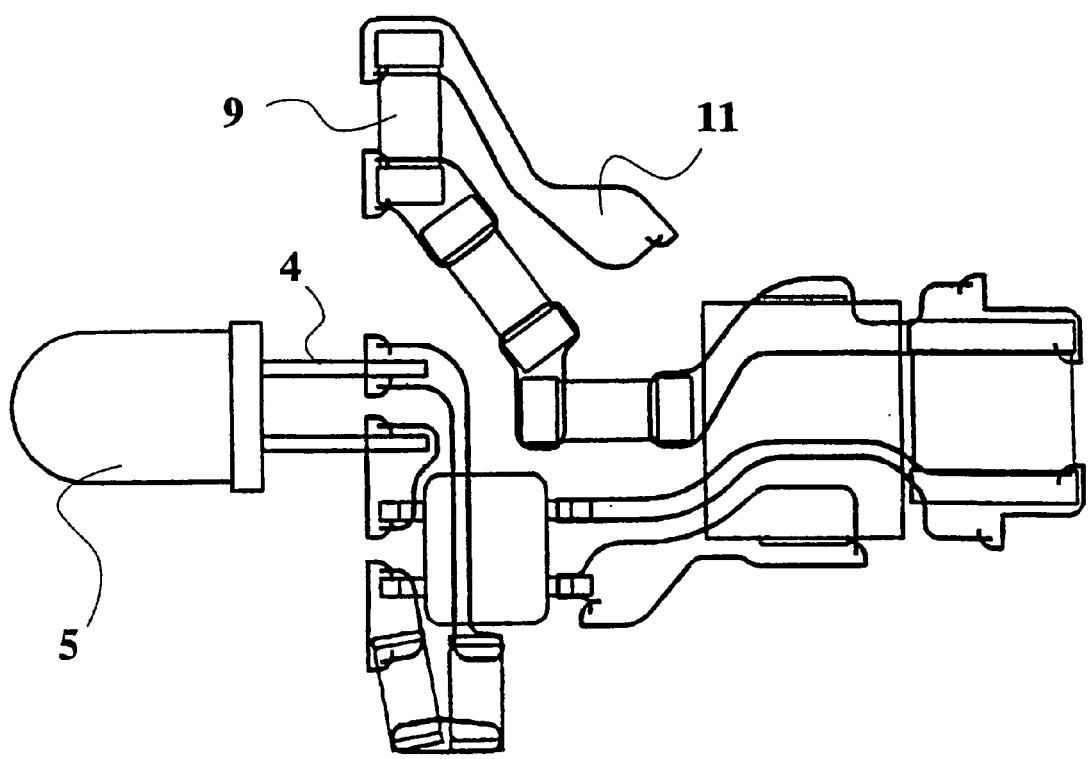
FIG. 6 shows a representation of the conductors, including components.

Initially, as shown in FIG. 3, a foil 14 of electrolytically obtained copper is applied, foil 14 having an outer contour appropriate for housing half 1. Subsequently, circuit conductors 11 are stamped using residual foil 12, as shown in FIG. 4. After the residual foil is pulled off, as depicted in FIG. 5, circuit conductors 11 remain in an arrangement on housing half 1. As illustrated in FIG. 6, electronic components 9 can be arranged on circuit conductors 11.

Figure 7:
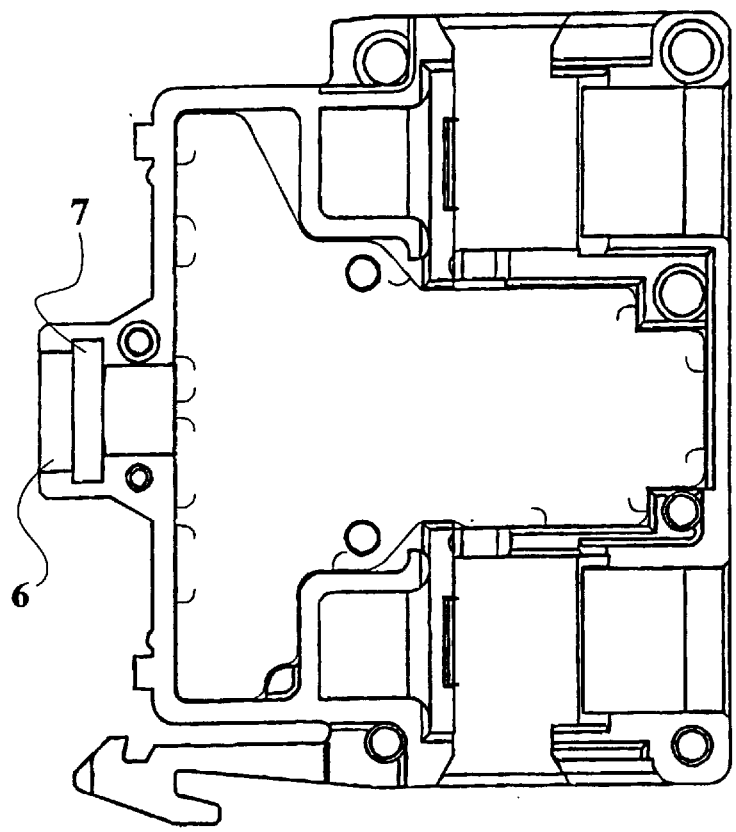
FIG. 7 shows a representation of the housing, including foil.
Figure 8:
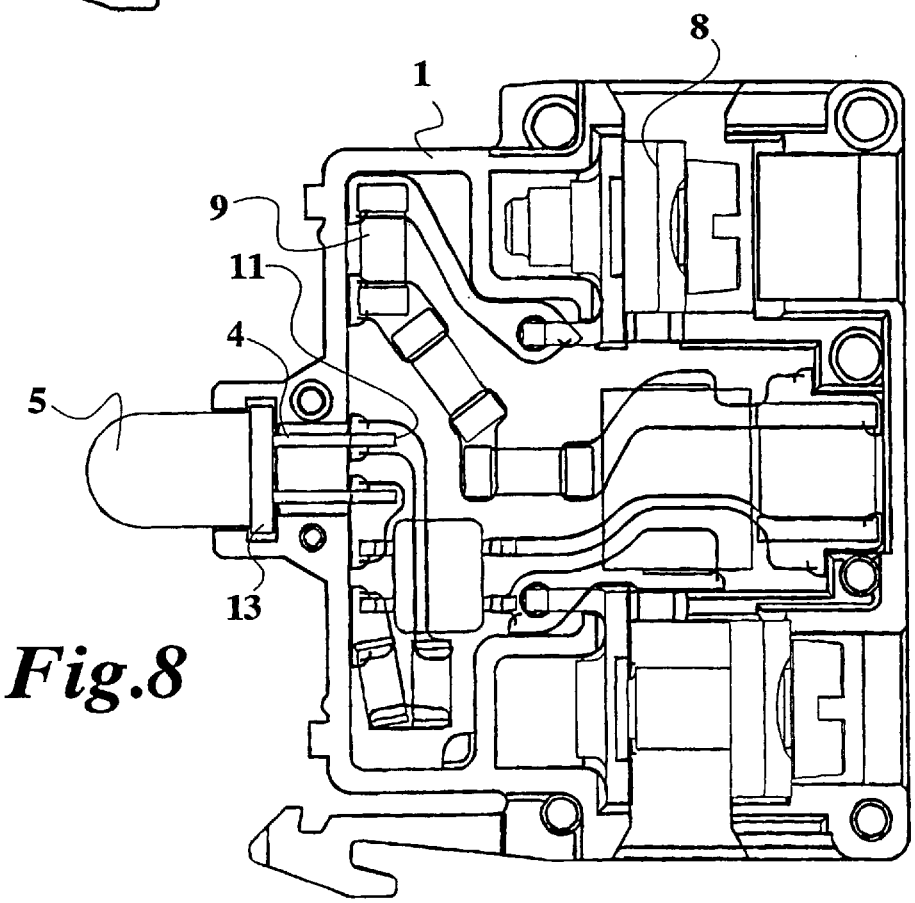
FIG. 8 shows a representation of the LED element built into the housing, complete with all components.

As is discernible in FIG. 7, in the vicinity of receptacle 6, a retaining groove 7 is provided, in which light-emitting diode 3 is held by a collar 13. To ensure that circuit conductors 11 are separated from residual foil 12 when they are stamped into housing half 1, the heat-embossing stamp must be designed to have sharp edges in the embossing area. It is customary for residual foil 12 to completely surround circuit conductors 11. This design ensures that residual foil 12 is able to be easily removed from the housing half following the embossing operation, and that the heat-embossing stamp always meets the foil during the embossing process, and never makes direct contact with housing half 1, which would cause it to become soiled. The space for circuit conductors 11 is enlarged.

To be able to emboss circuit conductors 11 into the corners of the housing half, the circuit conductor contours are rounded off at the outer regions. In this region, it is no longer necessary for the residual foil to surround circuit conductors 11! The embossing stamp is set back somewhat from the outer contour of circuit conductors 11, thereby preventing contact from being made with housing half 1.

To further optimize the loosening of residual foil 12, slits, for example in the form of quarter circles, can be cut into foil 14, prior to the embossing operation (see FIG. 3). These slits are located precisely at the transition between the sharp-edged and rounded region of the embossing stamp and intersect with the embossing contour (see FIG. 4).

What is claimed is:

1. A control and signaling unit or signaling unit including comprising:

a functional element including a housing half, a plurality of circuit conductors being disposed on an inner housing wall of the housing half so as to form an electronic circuit, the plurality of circuit conductors having been applied using a foil heat embossing process; and only one light emitting diode having an angle of radiation of 30–45° and a luminosity of at least 0.5 candela disposed in a receptacle of the functional element, the diode including a diode crown and connecting wires.

2. The control and signaling unit or signaling unit as recited in claim 1 wherein the diode is integrated into the functional element.

3. The control and signaling unit or signaling unit as recited in claim 1 wherein the diode is included in an illuminated pushbutton.

4. The control and signaling unit or signaling unit as recited in claim 1 further comprising a collar disposed in a retaining groove of the housing half in the area of the receptacle for securing the light emitting diode.

5. The control and signaling unit or signaling unit as recited in claim 1 wherein the functional element further includes electronic components.

6. The control and signaling unit or signaling unit as recited in claim 1 wherein the functional element further includes a latch.

\* \* \* \* \*